United States Patent
Murakami

(10) Patent No.: US 9,112,488 B2
(45) Date of Patent: Aug. 18, 2015

(54) SEMICONDUCTOR MEMORY DEVICE WITH A CLOCK CIRCUIT FOR REDUCING POWER CONSUMPTION IN A STANDBY STATE

(75) Inventor: Hiroki Murakami, Saitama-Pref (JP)

(73) Assignee: Winbond Electronics Corp., Taichung (TW)

( * ) Notice: Subject to any disclaimer, the term of this patent is extended or adjusted under 35 U.S.C. 154(b) by 395 days.

(21) Appl. No.: 13/303,153

(22) Filed: Nov. 23, 2011

(65) Prior Publication Data
US 2012/0287712 A1 Nov. 15, 2012

(30) Foreign Application Priority Data

May 12, 2011 (JP) ................................. 2011-106808

(51) Int. Cl.
G11C 7/10 (2006.01)
G11C 7/22 (2006.01)
G11C 5/14 (2006.01)
(Continued)

(52) U.S. Cl.
CPC ............ H03K 19/0016 (2013.01); G11C 5/147 (2013.01); G11C 5/148 (2013.01); G11C 7/1057 (2013.01); G11C 7/1084 (2013.01); G11C 7/225 (2013.01); G11C 16/20 (2013.01); G11C 16/30 (2013.01); *G11C 2207/2227* (2013.01)

(58) Field of Classification Search
CPC .......... G11C 5/14; G11C 5/147; G11C 5/148; G11C 7/1057; G11C 7/225; G11C 7/1084; G11C 16/20; G11C 16/30; G11C 2207/2227; H03K 19/0016
USPC ................ 365/189.09, 189.11, 226, 227, 229
See application file for complete search history.

(56) References Cited

U.S. PATENT DOCUMENTS 4,317,180 A 2/1982 Lies
5,521,878 A * 5/1996 Ohtani et al. ............... 365/233.1
(Continued)

FOREIGN PATENT DOCUMENTS

JP 05-210976 8/1993
JP 06-139373 5/1994
(Continued)

OTHER PUBLICATIONS

"Second Office Action of Korea Counterpart Application" with English translation thereof, issued on Sep. 30, 2013, p. 1-p. 7.
"Office Action of Taiwan Counterpart Application", issued on Feb. 24, 2014, p. 1-p. 6.
"Office Action of Korea Counterpart Application", issued on Mar. 26, 2014, with English translation thereof, p. 1-p. 7.

*Primary Examiner* — J. H. Hur
(74) *Attorney, Agent, or Firm* — Jianq Chyun IP Office

(57) ABSTRACT

A semiconductor device including a logic circuit capable of decreasing a leakage current occurred during a standby state is provided. The semiconductor device includes a power supply portion for supplying a first operation voltage or a second operation voltage smaller than the first operation voltage; a P-type low-threshold transistor Tp for receiving the first or the second operation voltage from the power supply portion; and a N-type transistor Tn connected between the transistor Tp and a base potential. The transistors Tp, Tn construct a logic circuit. The power supply portion supplies the first operation voltage to the source of the transistor Tp in the enable state, and supplies the second operation voltage in a standby state. The second operation voltage is set so that voltage amplitude between gate and source of each transistor Tp, Tn is larger than the threshold value of the transistors Tp, Tn.

11 Claims, 9 Drawing Sheets

(51) Int. Cl.
*H03K 19/00* (2006.01)
*G11C 16/20* (2006.01)
*G11C 16/30* (2006.01)

(56) References Cited

U.S. PATENT DOCUMENTS

| | | | |
|---|---|---|---|
| 6,107,700 A * | 8/2000 | Ishikawa et al. | 307/116 |
| 7,055,007 B2 * | 5/2006 | Flautner et al. | 711/156 |
| 7,603,575 B2 * | 10/2009 | Woodbridge et al. | 713/322 |
| 2005/0225379 A1 * | 10/2005 | Im et al. | 327/540 |
| 2006/0200684 A1 * | 9/2006 | Bibikar et al. | 713/300 |
| 2007/0058316 A1 * | 3/2007 | Lim et al. | 361/104 |
| 2007/0189102 A1 * | 8/2007 | Lin et al. | 365/230.06 |

FOREIGN PATENT DOCUMENTS

| | | |
|---|---|---|
| JP | 10-256896 | 9/1998 |
| JP | 11-328952 | 11/1999 |
| JP | 2000-013215 | 1/2000 |
| JP | 2002-305434 | 10/2002 |
| JP | 2004-147175 | 5/2004 |
| JP | 2005-065044 | 3/2005 |
| JP | 2007-194649 | 8/2007 |
| KR | 100610009 | 8/2006 |

* cited by examiner

|  | Vcc(Ext) | Vcc(Int) |
|---|---|---|
| enable state | V1 | V1 |
| standby state | V1 | V2 |

SEMICONDUCTOR MEMORY DEVICE WITH A CLOCK CIRCUIT FOR REDUCING POWER CONSUMPTION IN A STANDBY STATE

CROSS-REFERENCE TO RELATED APPLICATION

This application claims the priority benefit of Japan application serial no. 2011-106808, filed on May 12, 2011. The entirety of the above-mentioned patent application is hereby incorporated by reference herein and made a part of this specification.

BACKGROUND OF THE INVENTION

1. Field of the Invention

The invention relates to a semiconductor device including a logic circuit or a logic gate. Particularly, the invention relates to a semiconductor device capable of reducing power consumption in a standby state.

2. Description of Related Art

Regarding memories such as flash memories and dynamic memories etc., according to demands of large capacity, low price and low power consumption, and small size fabrication steps thereof are also required to be simplified. In order to implement the above demands, some side effects are produced, for example, in fabrication of a single layer of polysilicon, increase of a threshold of a P-channel metal oxide semiconductor transistor may cause a side effect that a high-speed operation is hard to be implemented. Therefore, to mitigate the above problem, a transistor with a low threshold is added. However, when the threshold is reduced, even if a voltage Vgs between a gate and a source of the transistor is 0V, a phenomenon of leakage current still exists, which may cause extra power consumption. Generally, the smaller the threshold is, the larger the leakage current is, and the more obvious the power consumption is.

According to a disclosure of Japan Patent No. 2004-147175, a gate oxide film power switching transistor is disposed between a gate oxide film logic gate with a low threshold and a power line, and in a standby state, a relatively large inverse bias is applied on the power switching transistor, so as to reduce the leakage current of the power switching transistor.

FIG. 1 is a schematic diagram of a conventional circuit for reducing a leakage current. The circuit is adapted to a clock synchronous data transmission circuit such as an input output data buffer, etc. The data transmission circuit includes a clock generation circuit C1 and an output circuit C2. The clock generation circuit C1 generates an internal clock signal InCLK according to an external clock signal ExCLK. The output circuit C2 synchronously outputs data according to the internal clock signal InCLK. The clock generation circuit C1 includes a first CMOS inverter (P1, N1), a second CMOS inverter (P2, N2), a P-channel MOS transistor Qp and an N-channel transistor Qn. The external clock signal ExCLK is input to the first CMOS inverter (P1, N1). The second CMOS inverter (P2, N2) is connected to an output of the first CMOS inverter (P1, N1), and outputs the internal clock signal InCLK. The P-channel MOS transistor Qp is connected between a power Vcc and the transistor P1, and the N-channel transistor Qn is connected between the output of the first CMOS inverter and the ground GND.

A power down signal P/D is applied to gates of the transistors Qp and Qn. The power down signal P/D is in a low logic level (which is represented by a "L" level hereinafter) during an enable state, and is in a high logic level (which is represented by a "H" level hereinafter) during a standby state. The P-channel transistors P1 and P2 used for constructing the first CMOS inverter and the second CMOS inverter are low-threshold transistors.

The output circuit C2 includes a third CMOS inverter (P3, N3), a fourth CMOS inverter (P4, N4), a P-channel transistor P5, an N-channel transistor N5, a P-channel transistor Qp and an N-channel transistor Qn. The internal data is input to the third CMOS inverter (P3, N3). The fourth CMOS inverter (P4, N4) is connected to the output of the third CMOS inverter, and outputs the above internal data. The P-channel transistor P5 and the N-channel transistor N5 are respectively connected in series to the third CMOS inverter. The P-channel transistor Qp is connected between the transistor P5 and the power Vcc, and the N-channel transistor Qn is connected between the output of the third CMOS inverter and the ground GND.

The inverter internal clock signal $\overline{InCLK}$ is applied to a gate of the transistor P5, and the internal clock signal InCLK is applied to a gate of the transistor N5. The power down signal P/D is applied to gates of the transistors Qp and Qn. The P-channel transistors P3 and P4 used for constructing the third CMOS inverter and the fourth CMOS inverter and the clock synchronous transistor P5 are low-threshold transistors.

During the enable operation, the power down signal P/D is in the logic low (L) level, so that the transistors Qp are in a turn-on state, and the power Vcc is coupled to the first CMOS inverter and the third CMOS inverter, and now the transistors Qn are in a turn-off state. Therefore, the internal clock signal InCLK synchronous to the external clock signal ExCLK is output from the clock generation circuit C1. Moreover, in the output circuit C2, when the internal clock signal InCLK connected to the transistors P5 and N5 has the logic low (L) level, the internal data is obtained by the third CMOS inverter, and the fourth CMOS inverter outputs data with the logic value corresponding to that of the input data.

If the standby state is entered, the power down signal P/D is in the logic high (H) level. Therefore, in the clock generation circuit C1, the transistor Qp is in the turn-off state, and the power voltage Vcc does not provide an operation voltage to the low-threshold transistor P1. Moreover, the transistor Qn is in the turn-on state, so that the internal clock signal InCLK output by the clock generation circuit C1 is fixed to the logic high (H) level. Moreover, in the output circuit C2, the power voltage Vcc does not provide the operation voltage to the transistor P3, and the transistor Qn is in the turn-on state. Therefore, the output data is fixed to the high level.

According to the above descriptions, in order to reduce the leakage currents of the low-threshold transistors P1 and P3, the general-threshold transistors Qp and Qn have to be connected in series, and have to be logically set according to the power down signal P/D. In this way, the low-threshold transistors P1 and P3 can be used to implement high-speed operation. However, since the transistors Qp and Qn are connected in series, channel widths of the transistor P1, the transistor Qp and the transistor P3, the transistor Qp are increased, so that in order to set the standby state, the logic portion has to be increased. Moreover, in the standby state, since the output data is fixed to the high level, when the standby state is changed to the enable state, the logic portion has to be initialised, which takes more time for implementation.

SUMMARY OF THE INVENTION

The invention is directed to a semiconductor device including a logic circuit capable of decreasing a leakage current occurred in a standby state, in order to resolve the problems mentioned in the related art.

Moreover, the invention is directed to a semiconductor device capable of being transformed from a standby state to an enable state without delay.

The invention provides a semiconductor device including a P-channel first MOS transistor, which at least receives a first operation voltage or a second operation voltage lower than the first operation voltage; an N-channel second MOS transistor, which is at least connected between the first MOS transistor and a base potential, where the first MOS transistor and the second MOS transistor construct a logic circuit generating an output signal corresponding to a signal input to gates thereof In an enable state, the first operation voltage is supplied to a source of the first MOS transistor, and in a standby state, the second operation voltage is supplied to the source of the first MOS transistor. The second operation voltage is set so that a voltage amplitude between a gate and the source of each of the first MOS transistor and the second MOS transistor is greater than a threshold of the first MOS transistor and the second MOS transistor.

In an exemplary embodiment of the invention, the semiconductor device further includes a selection circuit, where the selection circuit selects the first operation voltage in the enable state, and selects the second operation voltage in the standby state. In an exemplary embodiment, the selection circuit selects the first operation voltage or the second operation voltage according to a control signal from external. The semiconductor device further includes a generation circuit, which receives the first operation voltage from the external, and generates the second operation voltage according to the first operation voltage. The semiconductor device further includes a generation circuit, which receives the second operation voltage from the external, and generates the first operation voltage according to the second operation voltage.

In an embodiment of the invention, the logic circuit includes a first inverter circuit including the first MOS transistor and the second MOS transistor, and a second inverter circuit connected to the first inverter circuit and including the first MOS transistor and the second MOS transistor. An external clock signal is input to the first inverter circuit, and the second inverter circuit outputs an internal clock signal. The logic circuit further includes a circuit synchronously inputting/outputting data according to the internal clock signal. The logic circuit further includes a power supply portion used for supplying the first operation voltage or the second operation voltage, a P-channel third MOS transistor connected in series between the power supply portion and the first MOS transistor, and an N-channel fourth MOS transistor connected in series between the second MOS transistor and the base potential, where a first clock signal is input to a gate of the third MOS transistor, a second clock signal inverted to the first clock signal is input to a gate of the fourth MOS transistor, and data is input to the gates of the first MOS transistor and the second MOS transistor.

In an embodiment of the invention, the semiconductor device further includes a memory array comprising memory devices used for storing data and a data output circuit connected to the memory array, where the data output circuit includes the logic circuit. The standby state refers to a period when a chip enable signal is not input to the semiconductor device from external. Moreover, the standby state refers to a fixed period without performing a command operation after a chip enable signal is input.

According to the above descriptions, in the standby state, the second operation voltage lower than the first operation voltage is supplied to the first MOS transistor. Therefore, compared to supply of the first operation voltage, the leakage current of the first MOS transistor is reduced. Moreover, the second operation voltage is set so that the voltage amplitude between the gate and the source of each of the first MOS transistor and the second MOS transistor is greater than the threshold of the first MOS transistor and the second MOS transistor. Therefore, a logic level of the signal input to the logic circuit is maintained. Accordingly, when the standby state is changed to the enable state, the logic circuit is unnecessary to be initialised to implement quick processing. Moreover, it is unnecessary to add a transistor logically set according to the power down signal to the logic circuit as that does of the conventional technique, so that high integration and miniaturization of the logic circuit can be implemented.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Embodiments of the invention are described below in detail with reference of figures.

Figure 1:
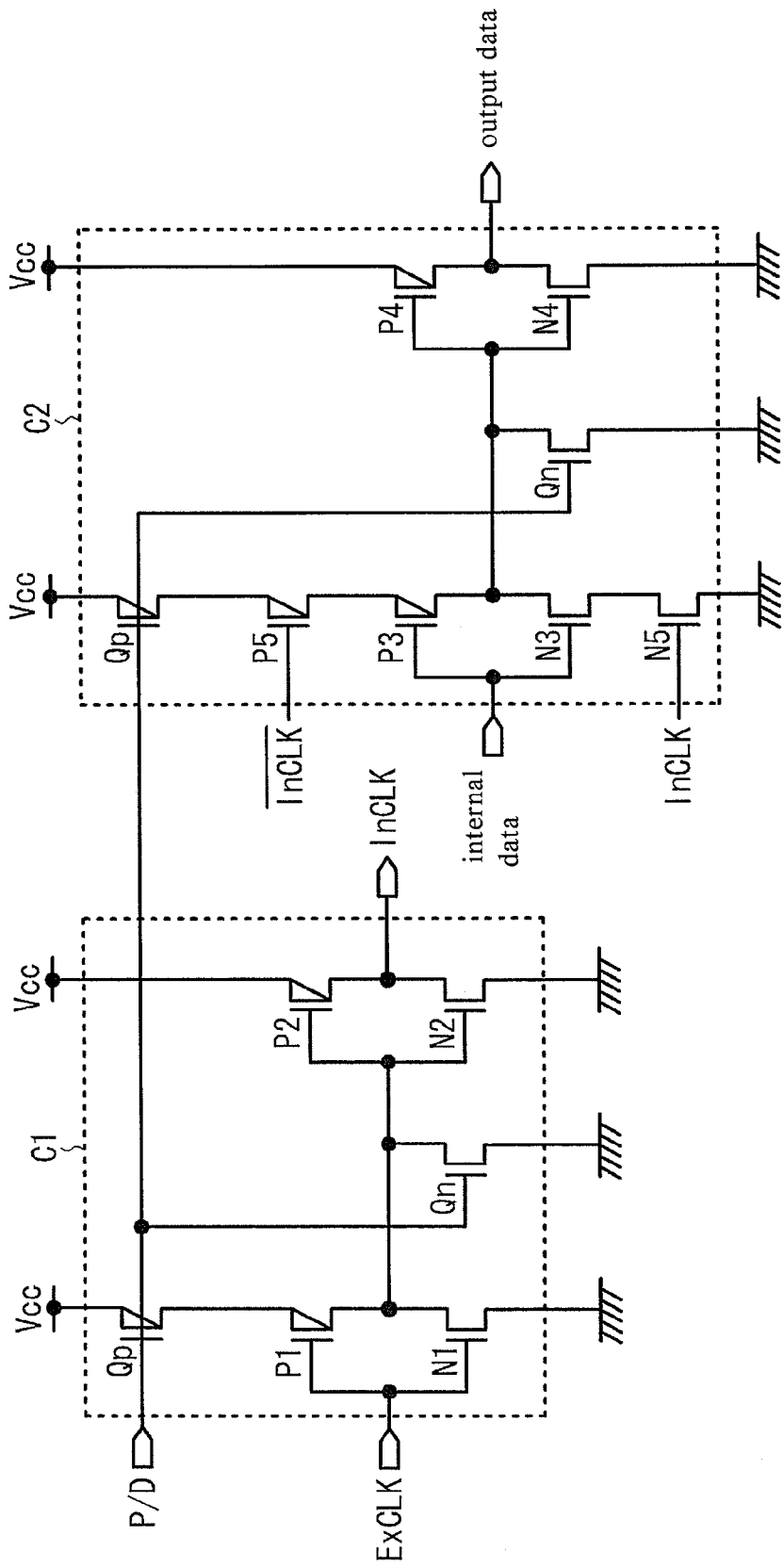
FIG. 1 is a schematic diagram of a conventional logic circuit for reducing a leakage current.
Figures 2, 3:
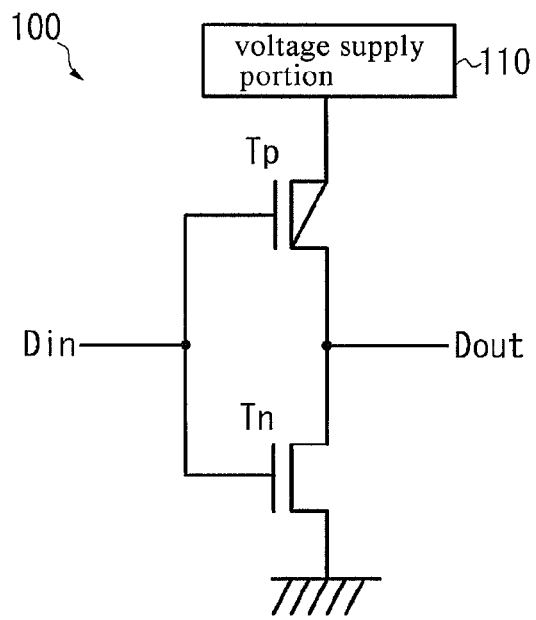
FIG. 2 is a basic structural diagram of a semiconductor device according to a first embodiment of the invention.
FIG. 3 is a relationship table of operation states and operation voltages provided by a voltage supply portion.

FIG. 2 is a basic structural diagram of a logic circuit of a semiconductor device according to a first embodiment of the invention. The semiconductor device 100 of the first embodiment includes a complementary metal-oxide semiconductor (CMOS) logic circuit or a CMOS logic gate formed on a silicon substrate, and in the embodiment, a CMOS inverter is taken as an example for descriptions, though the invention is not limited thereto.

The semiconductor device 100 includes a P-channel MOS transistor Tp, an N-channel MOS transistor Tn, and a power supply portion 110 used for supplying an operation voltage to the transistor Tp. The P-channel transistor Tp is preferably a low-threshold transistor, which has a gate insulation film thinner than a general insulation film.

The power supply portion 110 supplies the operation voltage to the CMOS inverter according to an operation state of the semiconductor device 100. In an exemplary embodiment, as shown in a table of FIG. 3, in an enable state of the semiconductor device 100, the power supply portion 110 sets an internal power Vcc(Int) to an operation voltage V1 the same to an external power Vcc(Ext), and in a standby state, the power supply portion 110 sets the internal power Vcc(Int) to an operation voltage V2 lower than the operation voltage V1 of the external power Vcc(Ext) (V1>V2). The power supply portion 110 includes a circuit capable of supplying the operation voltage V2 to serve as the internal power Vcc(Int), for example, a level conversion circuit or a DC-DC converter, etc.

Regarding the CMOS inverter of FIG. 2, in the enable state of the semiconductor device 100, the operation voltage V1 of 1.8V is, for example, supplied to a source of the P-channel transistor Tp. Since the transistor Tp has a low threshold, a turn-on state thereof is more stable when a logic low level signal is input, and now a switching speed is accelerated.

On the other hand, when the semiconductor device 100 is operated in the standby state or standby mode, the operation voltage V2 of 1.3V is, for example, supplied to the source of the P-channel transistor Tp. Now, the operation voltage V2 is set such that a voltage Vgs between a gate and the source of the transistor Tp is greater than a threshold of the transistors Tp and Tn. Namely, the operation voltage V2 is set to maintain a high level or a low level logic state of the signal input to the CMOS inverter. Since the operation voltage V2 is lower than the operation voltage V1, the switching speed of the transistor Tp is lower than that in the enable state, though the transistor Tp has a smaller leakage current when it is turned off.

In the standby state, when data Din input to the CMOS inverter has a logic low level, the transistor Tp is turned on, and the transistor Tn is turned off, and output data Dout has a logic high level. On the other hand, when the input data Din has the logic high level, the transistor Tp is turned off, the transistor Tn is turned on, and the output data Dout has the logic low level. Even if in the standby state, the semiconductor device 100 can still operate while maintaining the logic level, so that when the standby state is changed to the enable state, it is unnecessary to perform an initialisation operation that is necessary for the conventional logic circuit, and the standby state can be switched to the enable state without delay. Moreover, the standby state can also be defined according to an external signal applied to the semiconductor device, or the external signal can be used to determine whether the internal circuit of the semiconductor device is in the standby state. The so-called standby state may include a pattern of a fixed period when the semiconductor device stops operation, a pattern that the operation speed is less than a general operation speed or a pattern that the power consumption is less than the general power consumption. Moreover, the operation voltages V1 and V2 can be suitably selected according to sizes, the threshold and other operation features of the MOS transistors.

Figure 4A:
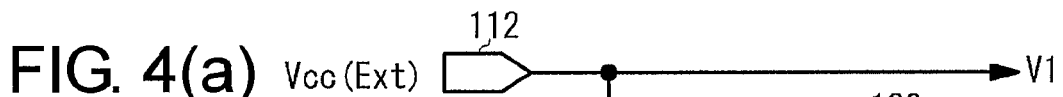
FIG. 4(a)-FIG. 4(c) are diagrams illustrating examples of a power supply portion.
Figure 4B:
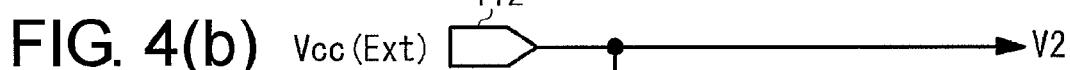
Figure 4C:
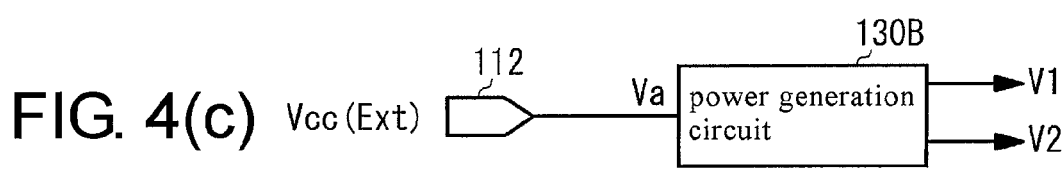

FIG. 4(a)-FIG. 4(c) are diagrams illustrating examples of the power supply portion 110. In the example of FIG. 4(a), the semiconductor device includes an external terminal 112 used for inputting the external power Vcc(Ext). The power supply portion 110 supplies the operation voltage V1 input through the external terminal 112 to serve as the external power Vcc (Ext). Moreover, the semiconductor device includes a voltage generation circuit 130 used for generating the operation voltage V2 according to the operation voltage V1 of the external power Vcc(Ext). The voltage generation circuit 130 supplies the operation power V2 to serve as the internal power Vcc (Int).

Moreover, in the example of FIG. 4(b), the operation voltage V2 is input to the semiconductor device through the external terminal 112 to serve as the external power Vcc(Ext). Moreover, a voltage generation circuit 130A boosts the operation voltage V2 of the external power Vcc(Ext) to produce the operation voltage V1 to serve as the internal power Vcc(Int). In the example of FIG. 4(c), a voltage Va is input to the semiconductor device through the external terminal 112 to serve as the external power Vcc(Ext). Moreover, a voltage generation circuit 130B generates the operation voltages V1 and V2 serving as the internal power Vcc(Int) according to the voltage Va. Besides the above descriptions, the operation voltages V1 and V2 can be input to the semiconductor device through the external terminal 112 to serve as the external power Vcc(Ext).

Figure 5A:
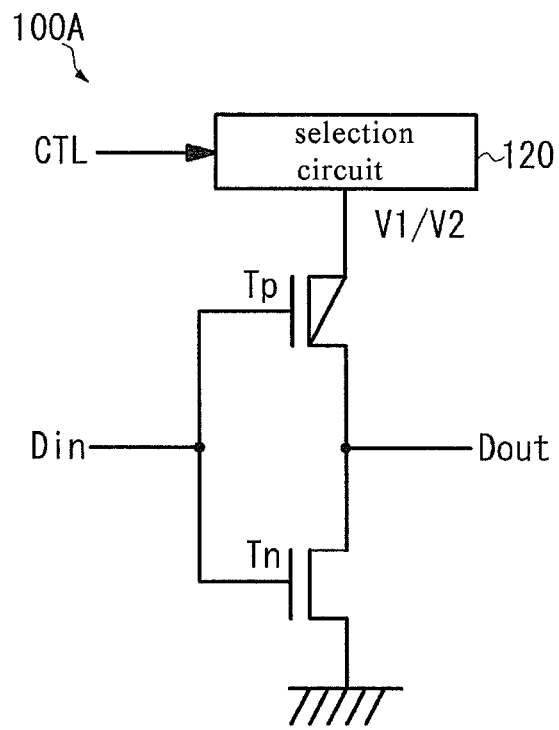
FIG. 5(a) and FIG. 5(b) are structural schematic diagrams of a semiconductor device according to a second embodiment of the invention.

Then, a second embodiment of the invention is introduced below with reference of FIG. 5(a) and FIG. 5(b). In the second embodiment, the semiconductor device 100A includes a selection circuit 120 used for switching the operation voltages V1 and V2 of the CMOS inverter. The selection circuit 120 receives a control signal CTL, and supplies the operation voltage V1 or the operation voltage V2 to the source of the transistor Tp according to the control signal CTL. The control signal CTL represents whether the semiconductor device is in the enable state or the standby state. Namely, the selection circuit 120 supplies the high operation voltage V1 in case of the enable state, and supplies the low operation voltage V2 in case of the standby state.

Figure 5B:
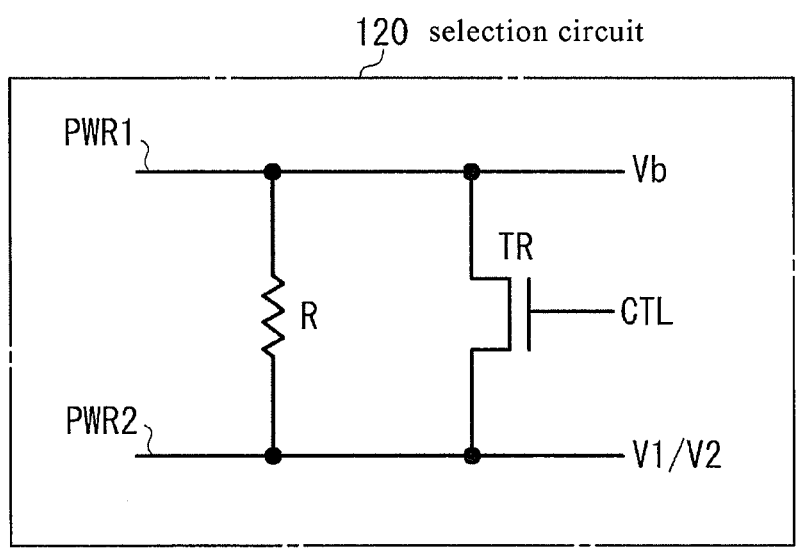

FIG. 5(b) is an exemplary embodiment of the selection circuit 120. The selection circuit 120 includes a power rail PWR1 used for supplying the external power or the internal power of Vb, a power rail PWR2 used for supplying the operation voltage V1 or the operation voltage V2, a resistor R connected between the power rail PWR1 and the power rail PWR2, and an N-channel MOS transistor TR connected in parallel to the resistor R. The control signal CTL is supplied to a gate of the transistor TR. In the enable state, the transistor TR is turned on in response to the control signal CTL, and the operation voltage V1 is supplied to the power rail PWR2. On the other hand, in the standby state, the transistor TR is not turned on in response to the control signal CTL, and the operation voltage V2 (which is smaller than V1) is supplied to the power rail PWR2. The selection circuit 120 can be constructed through a very simple structure.

Figure 6:
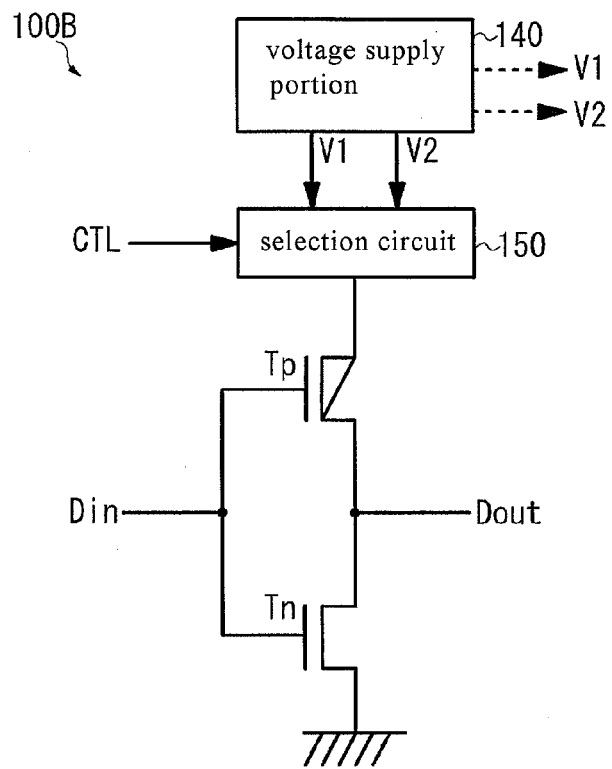
FIG. 6 is a structural schematic diagram of a semiconductor device according to a third embodiment of the invention.

Then, referring to FIG. 6, a circuit structure of a third embodiment is introduced below. In the third embodiment, the semiconductor device 100B includes a power supply portion 140 and a selection circuit 150. The power supply portion 140 provides the operation voltage V1 and the operation voltage V2. The selection circuit 150 receives the operation voltage V1 and the operation voltage V2 from the power supply portion 140, and selectively outputs one of the operation voltage V1 and the operation voltage V2 according to the control signal CTL. Similar to the first embodiment, the power supply portion 140 includes a voltage generation circuit used for generating the internal power Vcc(Int) according to the external power Vcc(Ext). The selection circuit 150 selects the operation voltage V1 or the operation voltage V2 according to the control signal CTL, and supplies the selected operation voltage to the source of the transistor Tp. The control signal CTL represents whether the semiconductor device 100B is in the enable state or the standby state. In the present embodiment, the selection circuit 150 may only select one of the operation voltage V1 and the operation voltage V2. Moreover, other circuits can be used to share the operation voltage V1 and the operation voltage V2 supplied by the power supply portion 140.

Figure 7:
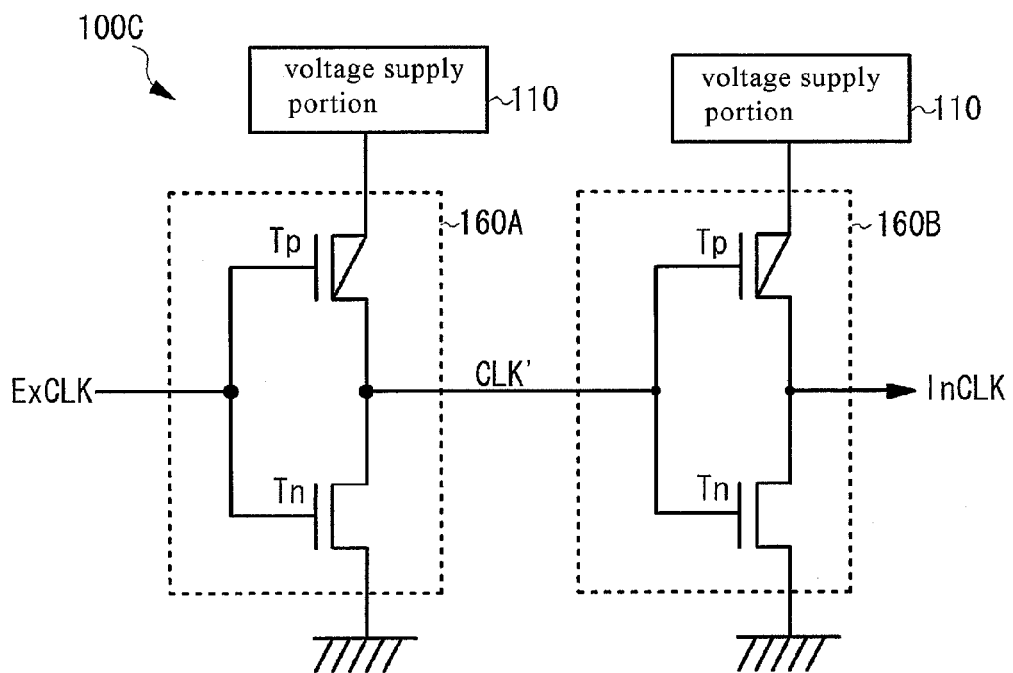
FIG. 7 is a structural schematic diagram of a semiconductor device according to a fourth embodiment of the invention.

Then, referring to FIG. 7, a circuit structure of a fourth embodiment is introduced below. The semiconductor device 100C of the fourth embodiment includes a clock generation circuit used for generating an internal clock signal InCLK according to an external clock signal ExCLK. The clock generation circuit includes a first CMOS inverter 160A and a second CMOS inverter 160B. The first CMOS inverter 160A receives the external clock signal ExCLK. The second CMOS inverter 160B receives an output of the first CMOS inverter 160A, and converts it into the internal clock signal InCLK for outputting. Similar to the first to the third embodiments, the power supply portion 110 selectively supplying the operation voltage V1 or the operation voltage V2 is connected to the first CMOS inverter 160A and the second CMOS inverter 160B.

In the enable state, the operation voltage V1 is supplied to the low-threshold transistors Tp in the first CMOS inverter 160A and the second CMOS inverter 160B to implement high-speed operation. Based on such structure, the internal clock signal InCLK with a short delay time is outputted according to the external clock signal ExCLK. On the other hand, in the standby state, the operation voltage V2 is provided to the low-threshold transistor Tp, though the operation voltage V2 is set so that a voltage amplitude of the external clock signal ExCLK is greater than a threshold of the transistor Tp. Therefore, the first CMOS inverter 160A outputs a clock signal CLK' maintained to the logic state of the external clock signal ExCLK, and the clock signal CLK' is input to the second CMOS inverter 160B. However, even in this case, since the operation voltage V2 is set, the amplitude of the clock signal CLK' is greater than the threshold of the transistor Tp, and the second CMOS inverter 160B outputs the internal clock signal InCLK maintained to the logic state of the clock signal CLK'. On the other hand, since the operation voltage V2 is smaller than the operation voltage V1, the leakage current of the low-threshold transistor Tp in the standby state is suppressed.

Figure 8A:
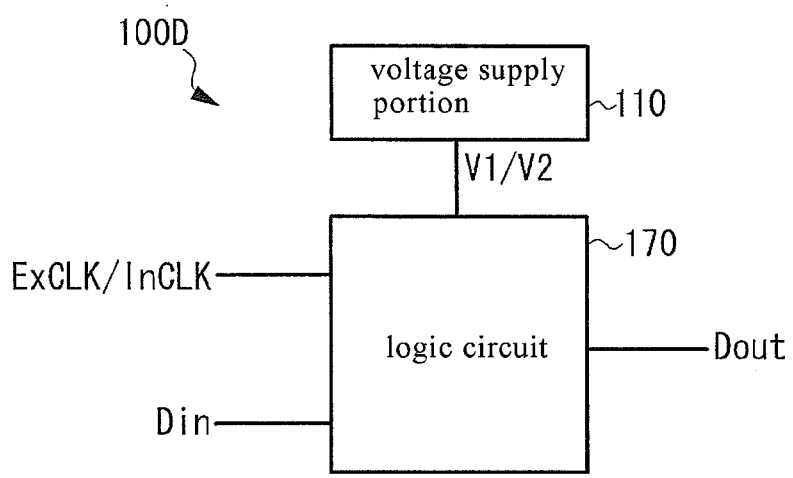
FIG. 8(a) and FIG. 8(b) are structural schematic diagrams of a semiconductor device according to a fifth embodiment of the invention.

Then, referring to FIG. 8(a) and FIG. 8(b), circuit structures of a fifth embodiment are introduced below. The semiconductor device 100D of the fifth embodiment includes the power supply portion 110 and a logic circuit 170. The power supply portion 110 selectively supplies the operation voltage V1 or the operation voltage V2 to the logic circuit 170. The logic circuit 170 includes a CMOS logic gate, where the CMOS logic gate has a low-threshold P-channel MOS transistor and an N-channel MOS transistor. The logic circuit 170 receives the external clock signal ExCLK or the internal clock signal InCLK, and the input data Din, and outputs the processed output data Dout that is synchronous to the clock signal. In the enable state, the operation voltage V1 is supplied to the logic circuit 170, and the low-threshold transistors are used to implement high-speed operation. In the standby state, the operation voltage V2 is supplied to the logic circuit 170, and the logic circuit 170 operates in a speed slower than that corresponding to the enable state, though it outputs data synchronous to the clock signal and maintained to the logic level of the CMOS logic gate.

Figure 8B:
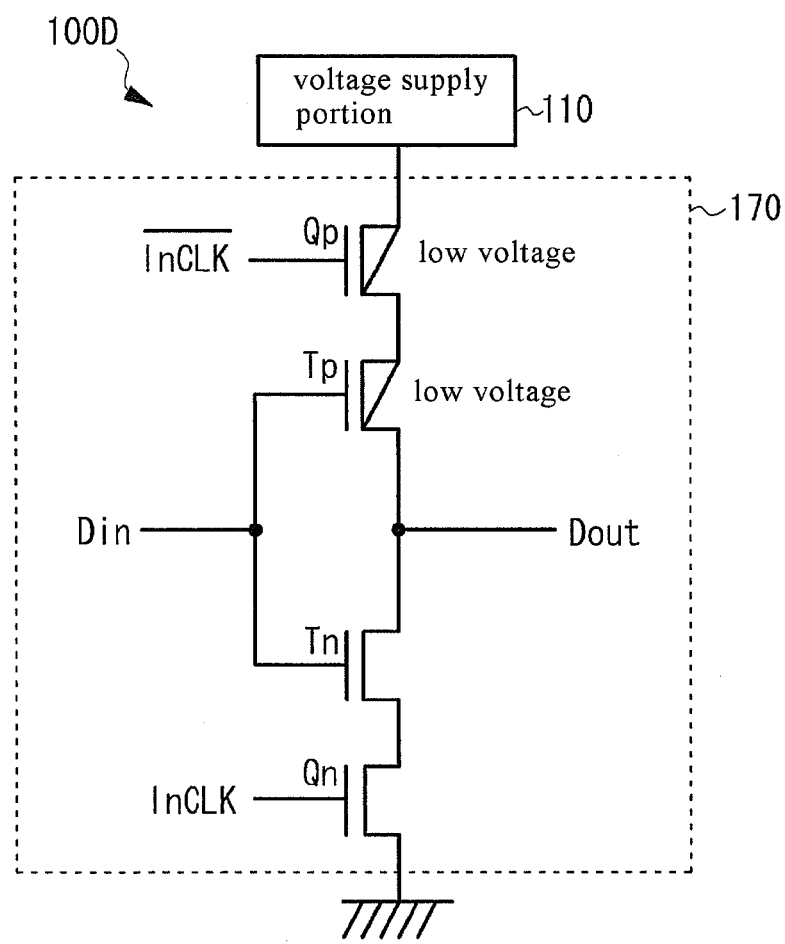

FIG. 8(b) is a circuit schematic diagram of an exemplary example of the logic circuit 170 of the fifth embodiment. The logic circuit 170 includes an inverter, a low-threshold P-channel transistor Tp, an N-channel transistor Tn, a low-threshold P-channel transistor Qp connected in series between the transistor Tp and the power supply portion 110, and an N-channel transistor Qn connected in series between the transistor Tn and the ground. The input data Din is input to the gates of the transistors Tp and Tn, the inverted internal clock signal $\overline{InCLK}$ is supplied to the gate of the transistor Qp, and the internal clock signal InCLK is supplied to the gate of the transistor Qn. In the enable state, the operation voltage V1 is supplied to the transistor Qp, the logic circuit 170 synchronously obtains the input data Din and the internal clock signal, and outputs the output data Dout.

In the standby state, the operation voltage V2 is supplied to the transistor Qp, and the leakage current of the transistor Qp is reduced, accordingly. On the other hand, the operation voltage V2 is set so that voltage amplitude of the internal clock signal is greater than the threshold of the transistor Qp. Therefore, when the transistor Qp is turned on, the operation voltage V2 is supplied to the source of the transistor Tp, and the transistor Tp is turned on or off according to a logic state of the input data Din.

Figure 9:
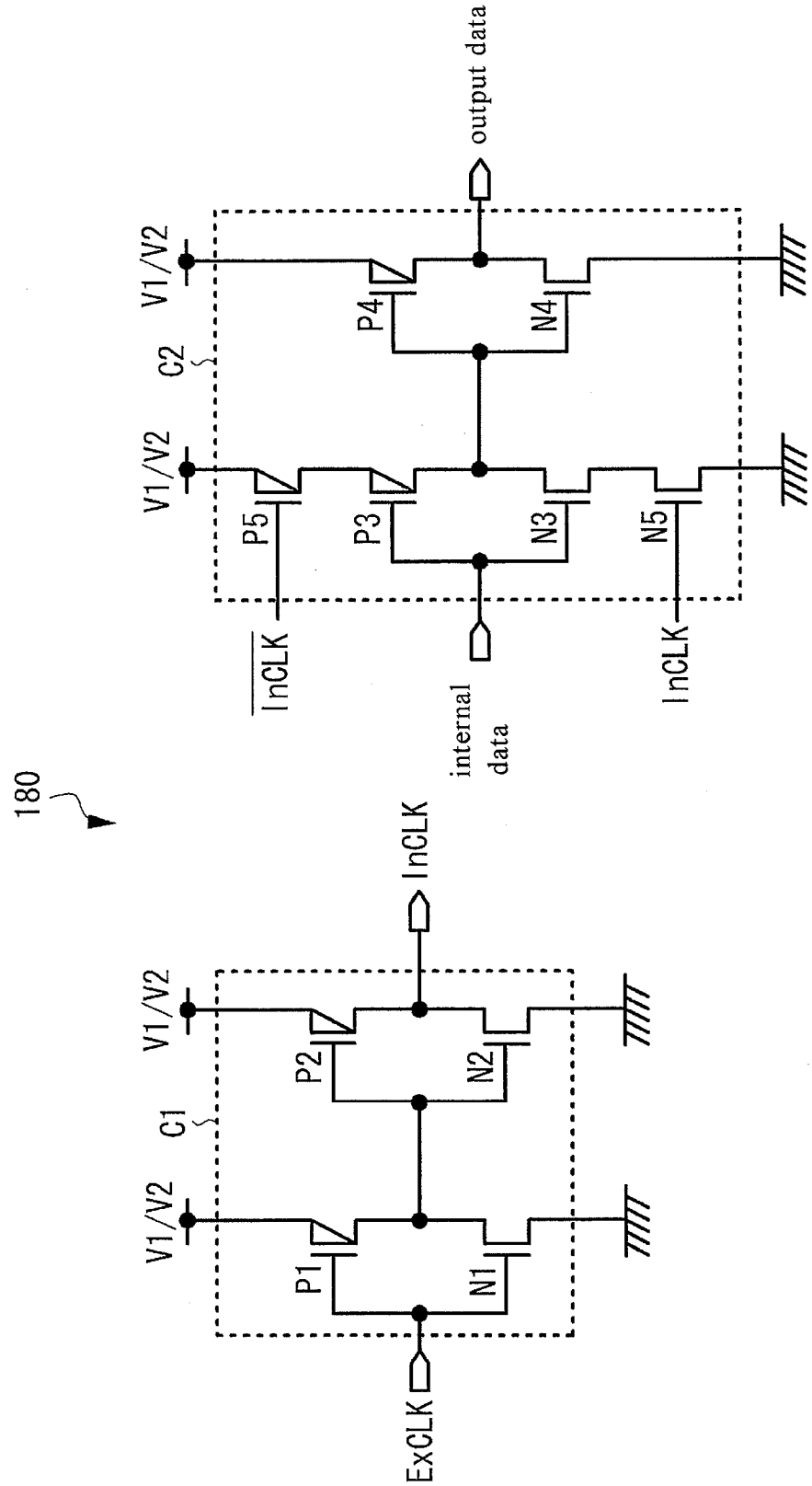
FIG. 9 is a structural schematic diagram of a semiconductor device according to a sixth embodiment of the invention.

Then, referring to FIG. 9 to FIG. 12, circuit structures of a sixth embodiment are introduced below. FIG. 9 illustrates a data output circuit 180 according to the sixth embedment of the invention. The data output circuit 180 is, for example, adapted to an NAND flash memory 100E shown in FIG. 12. As shown in FIG. 12, the flash memory 100E includes a memory array 200, an input output buffer 210, an address register 220, a data register 230, a controller 240, a word line selector 250, a page buffer/sensing circuit 260, a row selector 270 and an internal voltage generation circuit 280.

The memory array 200 has a plurality of memory units arranged in a matrix. The input output buffer 210 is connected to an external input output terminal I/O and stores input output data. The address register 220 receives address data from the input output buffer 210. The controller 240 receives command data from the data register 230 or the input output buffer 210, and controls the devices according to the commands. The word line selector 250 decodes a column address message Ax received from the address register 220, and selects a block and a word line according to the decoding result. The page buffer/sensing circuit 260 is used for sensing data read from a page selected by the word line selector 250, or holding write data to be written to the selected page. The row selector 270 decodes a row address message Ay received from the address register 220, and selects a bit line according to the decoding result. The internal voltage generation circuit 280 is used for generating voltages required for reading, programming and erasing data.

According to the above description, the internal voltage generation circuit 280 supplies the operation voltage V1 or V2 corresponding the enable state or the standby state. Although it is not illustrated, the flash memory 100E can receive an external clock signal, or a clock generation circuit is used to generate the clock signal.

The external input output terminal I/O includes a plurality of terminals, where the terminals can share an address input terminal, a data input terminal, a data output terminal and a command input terminal to input a command latch enable signal, an address latch enable signal, a chip enable signal, a read enable signal, a write enable signal or an output enable signal to serve as an external control signal, and then output a read/busy signal.

The memory array 200 includes two memory sets 200L and 200R that can be simultaneously accessed. The memory set 200L includes m blocks BLK(L)1, BLK(L)2, . . . , BLK(L) m+1 along a row direction, and the memory set 200R includes m blocks BLK(R)1, BLK(R)2, . . . , BLK(R)m+1 along the row direction. Each of the blocks of the memory set is connected to a bit line BL of n bits, and the NAND cell unit connecting a plurality of memory units in series is connected to the bit lines BL.

Data transmission is carried on among the input output buffer 210, the address register 220, the data register 230 and the controller 240. Commands, data and address messages sent by a memory controller (no shown) are provided to the controller 240, the address register 220 and the data register 230 through the input output buffer 210. Moreover, during a read operation, data read from the page buffer/sensing circuit 260 is transmitted to the input output buffer 210 through the data register 230.

The controller 240 performs a read, a program or an erase operation in sequence according to the command data received from the input output buffer 210. The command data may include a read command, a program command, an erase command, a chip enable signal CE, a write enable signal WE, a read enable signal RE, an address latch enable signal ALE, a command latch enable signal CLE and an output enable signal OE, etc. For example, the controller 240 discriminates the address message and the write data according to the command data, and transmits the address message to the word line selector 250 or the row selector 270 through the address register 220, and transmits the write data to the page buffer/sensing circuit 260 through the data register 230.

The word line selector 250 decodes upper bits of a column address message received from the address register 220 to select pages of a pair of selected blocks in the two memory sets 200L and 200R. The page buffer/sensing circuit 260 is connected to the data register 230, and transmits read data to the data register 230 or receives write data from the data register 230 according to a read/write command. The row selector 270 decodes the row address message Ay received from the address register 220, and selects data or a bit line held in the page buffer/sensing circuit 260 according to the decoding result.

The data output circuit 180 of FIG. 9 is, for example, adapted to the input/output buffer 210. The data output circuit 180 includes a clock generation circuit C1 and a data output circuit C2. The clock generation circuit C1 generates the internal clock signal InCLK according to the external clock signal ExCLK. The data output circuit C2 synchronously outputs data according to the internal clock signal InCLK generated by the clock generation circuit C1. P1, P2, P3, P4 and P5 are low-threshold P-channel MOS transistors, and N1, N2, N3, N4 and N5 are N-channel MOS transistors.

Figure 10A:
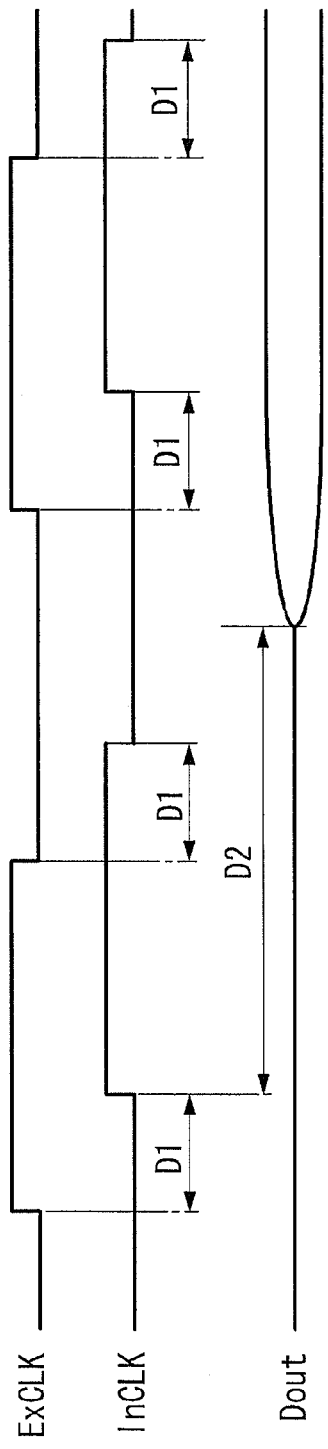
FIG. 10(a) is a timing diagram of the logic circuit of FIG.1 in which transistors have a high threshold.
Figure 10B:
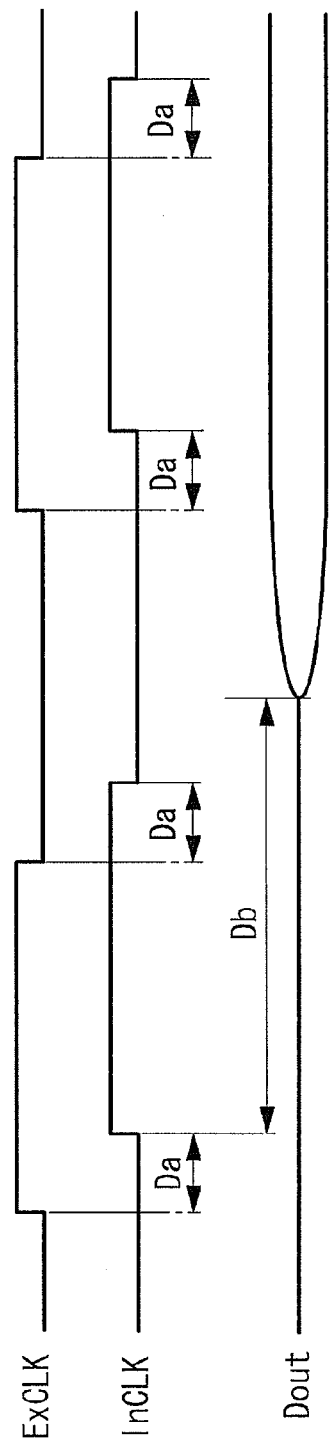
FIG. 10(b) is a timing diagram of the logic circuit of FIG.1 in which transistors have a low threshold.

FIG. 10(a) is an operational waveform diagram of the data output circuit in which the transistors P1-P5 have a high threshold Th1, and FIG. 10(b) is an operational waveform diagram of the data output circuit of FIG. 9 in which the transistors P1-P5 have a low threshold Th2 (Th2<Th1). In the data output circuit that the transistors have a high threshold, the internal clock signal InCLK is generated after a delay time D1 after the external clock signal ExCLK is received, and the output data Dout is generated after a delay time D2 after the internal clock signal InCLK is generated. On the other hand, in the data output circuit 180 that the transistors P1-P5 have a low threshold, the internal clock signal InCLK is generated after a delay time Da (Da<D1), and the output data Dout is generated after a delay time Db (Db<D2) after the internal clock signal InCLK is generated.

Figure 11:
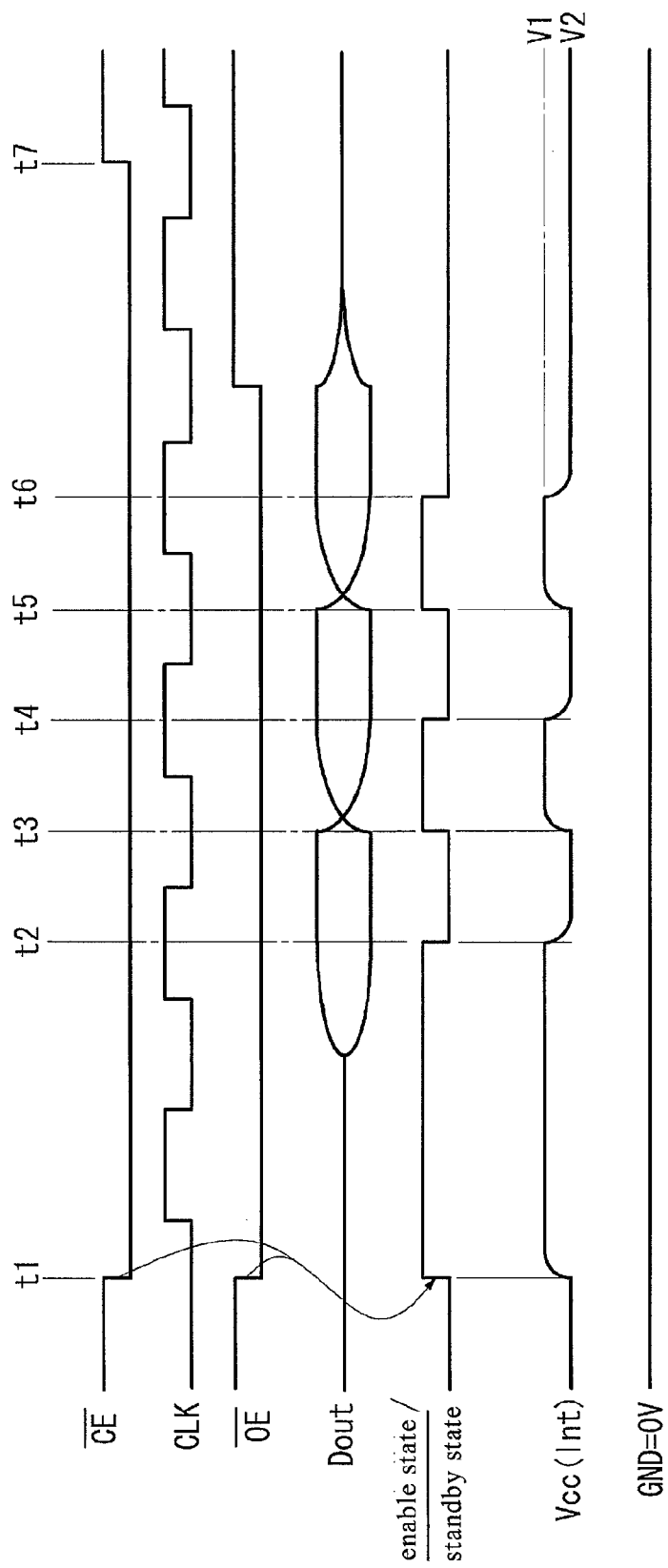
FIG. 11 is a timing diagram of a flash memory using the data output circuit of the sixth embodiment of the invention.
Figure 12:
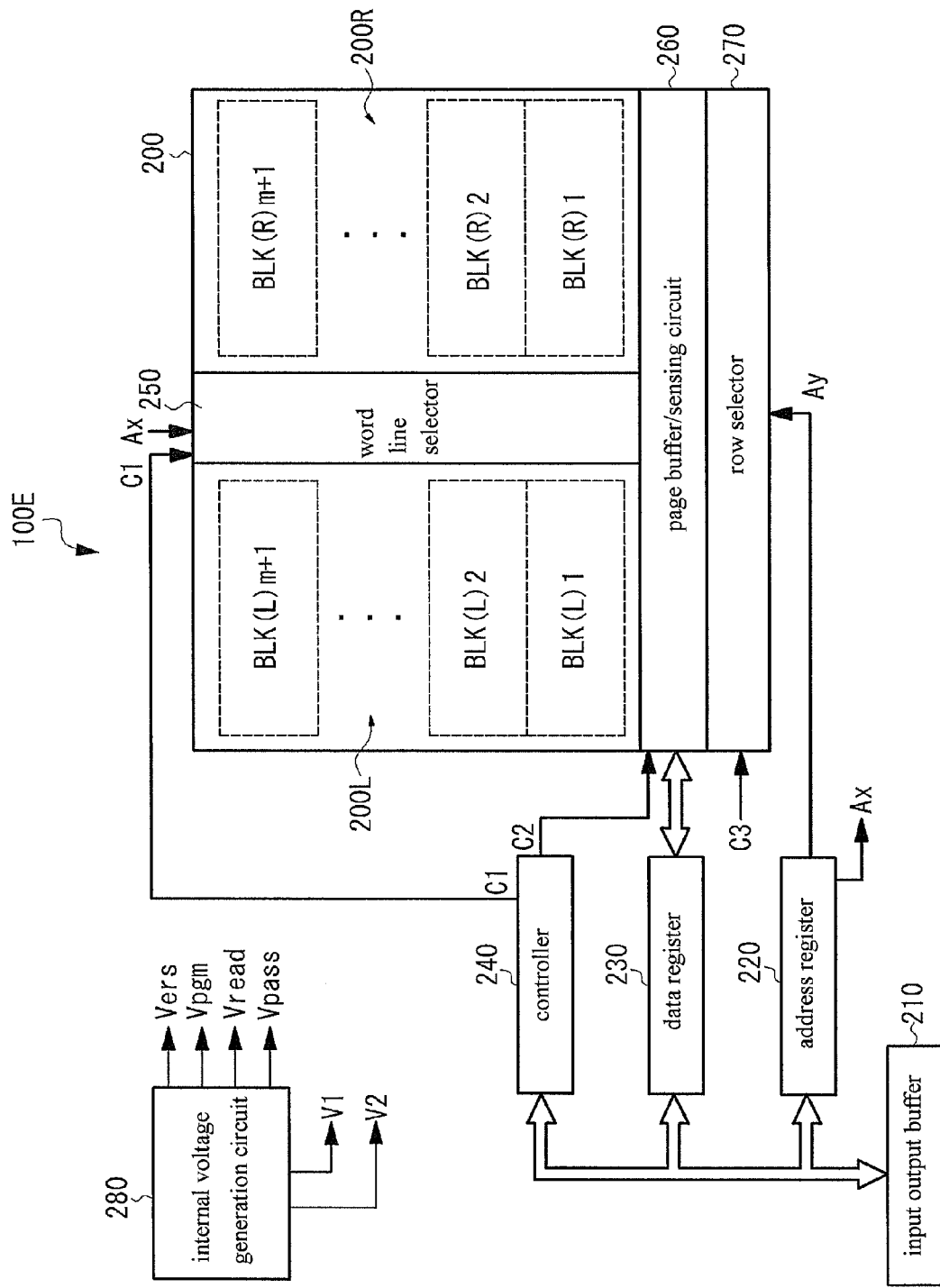
FIG. 12 is a block schematic diagram illustrating a circuit structure of a flash memory using the data output circuit of the sixth embodiment of the invention.

FIG. 11 is an operational waveform diagram obtained when the data output circuit 180 of FIG. 9 is applied to the flash memory 100E. At a time point t1, if a chip enable signal CE and an output enable signal OE (which are all low active) are taken as external control signals, and are input to the flash memory 100E, the controller 240 changes a control signal from the logic low level representing the standby state to the logic high level representing the enable state in response to the external control signals. The control signal is provided to various parts of the flash memory, and the internal voltage generation circuit 280 generates the operation voltage V1 in response to the control signal of the enable state, and supplies the operation voltage V1 to the data output circuit 180. Here, the internal voltage generation circuit 280 boosts the operation voltage V2 to generate the operation voltage V1 serving as the internal power Vcc(Int).

The controller 240 outputs the control signal of the enable state during a corresponding command processing period (t1-t2), and during such period, the operation voltage V1 is supplied to the data output circuit 180. Therefore, synchronous to the clock signal CLK, the data output circuit 180 generates the output data Dout after a fixed delay time of the clock signal CLK. If the control signal is switched to the standby state, the internal voltage generation circuit 280 supplies the operation voltage V2 to the data output circuit 180 in response to the control signal. In case that the controller 240 has to carry on the high-speed processing according to a predetermined operation sequence, during a period t3-t4 and a period t5-t6, the control signal is switched to the enable state, and in such periods, the operation voltage V1 is supplied to the data output circuit 180. When the control signal is in the standby state (a period t2-t3, a period t4-t5 and a period t6-t7), the operation voltage V2 is supplied to the data output circuit 180. However, since the clock generation circuit C1 maintains the logic state of the clock signal CLK, even if the control signal is switched from the standby state to the enable state, the data output circuit is unnecessary to be initialised, so as to reduce a delay time for outputting the output data Dout.

The aforementioned logic circuit is only an example, and the invention is also adapted to other CMOS logic gates or CMOS logic circuits. Moreover, besides the flash memory, the invention is also adapted to various semiconductor devices such as a dynamic random access memory (DRAM), a static random access memory (SRAM), a micro controller, a microprocessor, and an application-specific integrated circuit (ASIC), etc.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A semiconductor device, comprising:
a P-channel first MOS transistor, at least receiving a first operation voltage or a second operation voltage lower than the first operation voltage; and
an N-channel second MOS transistor, at least connected between the first MOS transistor and a base potential,
wherein the first MOS transistor and the second MOS transistor construct a logic circuit that generates an output signal according to a signal input to gates of the first MOS transistor and the second MOS transistor, wherein
in an enable state, the first operation voltage is supplied to a source of the first MOS transistor, and
in a standby state, the second operation voltage is supplied to the source of the first MOS transistor, the second operation voltage is set so that a voltage between a gate and the source of the first MOS transistor and a voltage amplitude between a gate and the source of the second MOS transistor are respectively greater than a threshold of the first MOS transistor and the second MOS transistor, wherein the logic circuit comprises:

a first inverter circuit comprising the first MOS transistor and the second MOS transistor;

a second inverter circuit, connected to the first inverter circuit, comprising a P-channel fifth MOS transistor and a N-channel sixth MOS transistor, wherein an external clock signal is input to the first inverter circuit, and the second inverter circuit outputs an internal clock signal according to the external clock signal; and a power supply portion for supplying the first operation voltage or the second operation voltage, wherein in the enable state, the first operation voltage is supplied to the first MOS transistor in the first inverter circuit and the fifth MOS transistor in the second inverter circuit, wherein in the standby state, the second operation voltage is supplied to the first MOS transistor in the first inverter circuit and the fifth MOS transistor in the second inverter circuit, and the second operation voltage is set so a voltage amplitude of the external clock signal is greater than the threshold of the first MOS transistor in the first inverter circuit and the fifth MOS transistor in the second inverter circuit.

2. The semiconductor device as claimed in claim 1, further comprising a selection circuit, wherein the selection circuit selects the first operation voltage in the enable state, and selects the second operation voltage in the standby state.

3. The semiconductor device as claimed in claim 2, wherein the selection circuit selects the first operation voltage or the second operation voltage according to a control signal from external.

4. The semiconductor device as claimed in claim 1, further comprising a generation circuit, wherein the generation circuit receives the first operation voltage from external, and generates the second operation voltage according to the first operation voltage.

5. The semiconductor device as claimed in claim 1, further comprising a generation circuit, wherein the generation circuit receives the second operation voltage from external, and generates the first operation voltage according to the second operation voltage.

6. The semiconductor device as claimed in claim 1, wherein the logic circuit further comprises a circuit synchronously inputting or outputting data according to the internal clock signal.

7. The semiconductor device as claimed in claim 1, wherein the logic circuit further comprises:

a P-channel third MOS transistor connected in series between the power supply portion and the first MOS transistor; and an N-channel fourth MOS transistor connected in series between the second MOS transistor and the base potential, wherein a first clock signal is input to a gate of the third MOS transistor, a second clock signal, inverted from the first clock signal is input to a gate of the fourth MOS transistor, data is input to the gates of the first MOS transistor and the second MOS transistor.

8. The semiconductor device as claimed in claim 1, further comprising a memory array, comprising memory devices used for storing data; and a data output circuit connected to the memory array, wherein the data output circuit comprises the logic circuit.

9. The semiconductor device as claimed in claim I, wherein the standby state refers to a period when a chip enable signal is not input to the semiconductor device from external.

10. The semiconductor device as claimed in claim 1, wherein the standby state refers to a fixed period without performing a command operation after a chip enable signal is input.

11. The semiconductor device as claimed in claim 10, wherein the semiconductor device is a flash memory.

* * * * *